United States Patent [19]
Lee et al.

[11] Patent Number: 5,468,665
[45] Date of Patent: Nov. 21, 1995

[54] PROCESS FOR MAKING A SEMICONDUCTOR MOS TRANSISTOR EMPLOYING A TEMPORARY SPACER

[75] Inventors: Chang-Jae Lee, Chungcheongbuk-do; Hyunsang Hwang, Seoul, both of Rep. of Korea

[73] Assignee: Goldstar Electron Co., Ltd., Cheongju, Rep. of Korea

[21] Appl. No.: 376,514

[22] Filed: Jan. 23, 1995

[30] Foreign Application Priority Data

Jan. 21, 1994 [KR] Rep. of Korea .................. 94-1118

[51] Int. Cl.$^6$ .................... H01L 21/335; H01L 21/8238
[52] U.S. Cl. .................. 437/44; 437/41; 437/57; 437/228; 437/984
[58] Field of Search ................ 437/41, 44, 56, 437/57, 58, 193, 200, 228, 984, 241; 257/336, 338

[56] References Cited

U.S. PATENT DOCUMENTS

| | | | |
|---|---|---|---|
| 4,599,118 | 7/1986 | Han et al. | 437/44 |
| 4,722,909 | 2/1988 | Parillo et al. | 437/34 |
| 4,851,365 | 7/1989 | Jeuch | 437/43 |
| 5,061,647 | 10/1991 | Roth et al. | 437/40 |
| 5,162,884 | 11/1992 | Liou et al. | 257/384 |
| 5,182,619 | 1/1993 | Pfiester | 257/382 |
| 5,202,277 | 4/1993 | Kameyama et al. | 437/41 |
| 5,217,913 | 6/1993 | Watabe et al. | 437/44 |
| 5,290,723 | 3/1994 | Tani et al. | 437/43 |
| 5,296,410 | 3/1994 | Yang | 437/228 |
| 5,366,913 | 11/1994 | Nakao | 437/41 |
| 5,374,575 | 12/1994 | Kim et al. | 437/44 |

OTHER PUBLICATIONS

Pfiester, J. R., "LLD MOSFET Using Disposable Sidewall Spacer Technology", IEEE Elec. Dev. Lett., 9(4), Apr. 1988, pp. 189–192.

Ronkainen, H., et al., "The Use of Disposable Double Spacer . . . ", IEEE Elec. Dev. Lett., 12(3), Mar. 1991, pp. 125–127.

Parillo, L. C., et al., "Disposable Polysilicon LDD Spacer Technology", IEEE Trans. Elec. Dev., 38(1), Jan. 1991, pp. 39–46.

Shigeo Onishi, et al; "Formation of a Defect–Free Junction Layer by Controlling Defects Due to As* Implantation"; Apr. 1991 IEEE/IRPS; pp. 255–259.

Masaharu Oshima; "A Study of Dry Etching–Related Contaminations on Si and SiO$_2$"; Surface Science Jul. 1979, vol. 86, No. 2, pp. 858–865.

K. Sunouchi, et al; "Double LDD Concave (DLC) Structure for Sub–Half Micron Mosfet"; IEDM 88; Dec. 1988, pp. 226–229.

*Primary Examiner*—T. N. Quach
*Attorney, Agent, or Firm*—Alan R. Loudermilk

[57] ABSTRACT

In the method of present invention, an LDD MOSFET is formed without using a side wall spacer as an ion implantation inhibiting layer. The process includes the steps of: forming a first insulating layer, a conductive layer and an auxiliary layer upon a semiconductor substrate, removing relevant portions of the auxiliary layer to form an auxiliary layer pattern such as a gate pattern on the conductive layer; depositing a temporary layer on the auxiliary layer pattern and on the exposed conductive layer, and etching it back to form a temporary layer spacer on the side wall of the auxiliary layer pattern; removing relevant portions of the conductive layer utilizing the auxiliary layer pattern and the temporary layer spacer as a mask, and forming a high concentration first dopant buried layer within the semiconductor substrate; and removing the temporary layer spacer, forming a gate electrode by etching the conductive layer utilizing the auxiliary layer pattern as a mask, and forming a low concentration second dopant buried layer within the semiconductor substrate. Applications to form CMOS devices are also disclosed.

24 Claims, 10 Drawing Sheets

DEPENDENCE OF JUNCTION LEAKAGE ON CLEANING METHODS

| ETCH | CLEANING METHOD | JUNCTION LEAKAGE (nA AT 3.3V) |
|---|---|---|
| DRY + WET ETCH | SCI + HF | 4.1 |
| 10% OVER ETCH | SCI + HF | 6.4 |
| 30% OVER ETCH | SCI + HF | 60.0 |
| 30% OVER ETCH | SILICON LIGHT ETCH + SCI + HF | 4.0 |

FIG. 10A
NMOS

FIG. 10B
PMOS

FIG. 10C
NMOS

FIG. 10D

PMOS

FIG. 10E

NMOS

PROCESS FOR MAKING A SEMICONDUCTOR MOS TRANSISTOR EMPLOYING A TEMPORARY SPACER

FIELD OF THE INVENTION

The present invention relates to processes for making semiconductor devices, and more particularly to processes for forming MOS field effect transistors (FETs) having a lightly doped drain (LDD) in a high density device.

BACKGROUND OF THE INVENTION

Generally, a semiconductor integrated circuit requires high circuit performance and high density. Therefore, in the case of a metal oxide semiconductor field effect transistor (or "MOSFET"), the technology for the forming a semiconductor integrated circuit has been scaled down to a sub-micron range as a result of the efforts to reduce the size of the device. Only through a reduction of the horizontal dimension, and a proportionate reduction of the vertical dimension, can a functional equilibrium between various devices be achieved. That is, if the distance between the source and drain is reduced as a result of the reduction of the size of the device, an undesirable variation of the characteristics of the device occurs, a typical example being the short channel effect. If this short channel effect is to be overcome, a horizontal scale-down has to be carried out; that is, the gate length has to be reduced. Further, a vertical scale-down has to be carried out; that is, the thickness of the gate insulation dielectrics and the depth of the junction and the like have to be reduced. Further, the applied voltage has to be lowered, and the doping concentration of the semiconductor substrate has to be increased. Particularly, the doping profile for the ion implantation depth of the channel region has to be controlled. The applied voltage for the semiconductor device, however, has to satisfy the power source for the electronic apparatus in which the semiconductor device is used. Therefore, while the dimension of the semiconductor device is scaled down, the electrical dimension for the applied power source of the circuit is not reduced. In the case of a MOS device, particularly in the case of an NMOS transistor, the distance between the source and drain is reduced as a result of the reduction of the channel. Accordingly, the electrons which are supplied from the source are abruptly accelerated by a high electric field near a pinch-off region near the channel of the drain junction, thereby producing hot carriers. Thus, the NMOS transistor is vulnerable to these hot carriers. (Refer to Chenming Hu et al., "Hot-electron-induced MOSFET Degradation-Model, Monitor and Improvement", IEEE Transactions on Electron Devices, Vol. ED-32, No. 2, February 1985, pp. 375–385).

According to the above cited paper, the instability of hot carriers is caused by a high electric field near the drain junction, which is caused by the short channel length and the high applied voltage. Hot carriers thus generated are injected into the gate insulating layer, which can result in substrate current. Therefore, an LDD (lightly doped drain) structure was proposed in 1978, which improves the NMOS device which is subject to hot carriers and has a reduced channel length. (Refer to K. Saito et al., "A New Short Channel MOSFET with Lightly Doped Drain", denshi tsushin rengo taikai (in Japanese), April 1978, p. 220) .

The LDD structure has characteristics such that the side length is narrow, and a self-aligned lightly doped $n^-$ region is disposed between the channel and the highly doped $n^+$ source/drain region. This $n^-$ lightly doped region spreads out the high electric field near the drain junction, so that carrier electrons supplied from the source are not abruptly accelerated, thereby overcoming the current instability due to hot carriers. Since studies on semiconductor devices of over 1 mega-bit DRAMs have begun, techniques for manufacturing MOSFETs having an LDD structure have been proposed in various forms. Of them, the most typical one is that in which the LDD is formed by providing a side wall spacer on each of the side walls of the gate, and this technique is being used in most mass production devices.

FIG. 1 illustrates a conventional process for forming an NMOS transistor having an LDD structure.

Figure 1A:
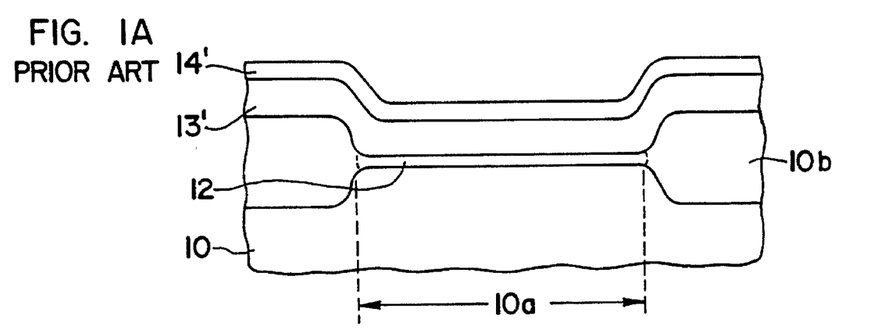
FIGS. 1A–1F illustrate a process for formation of an NMOS transistor having an LDD structure based on a conventional technique.

First referring to FIG. 1A, active region 10a and isolated region 10b are formed upon silicon substrate 10. Gate insulating layer 12 is formed on the surface, and polysilicon layer 13' is formed thereupon. Cap gate oxide layer 14' is formed on polysilicon layer 13'.

Figure 1B:
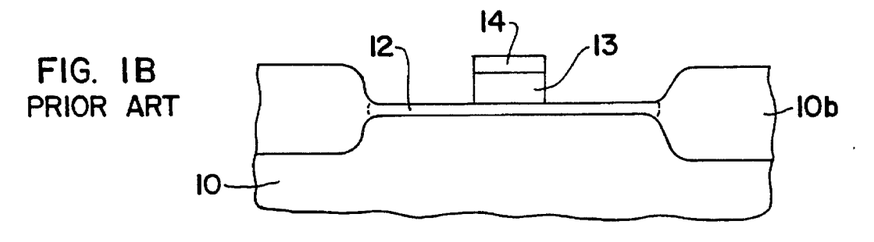

As illustrated in FIG. 1B, cap gate oxide layer 14' and polysilicon layer 13' are etched by applying a photo etching method, thereby forming gate (electrode) 13 over which is oxide layer 14.

Figure 1C:
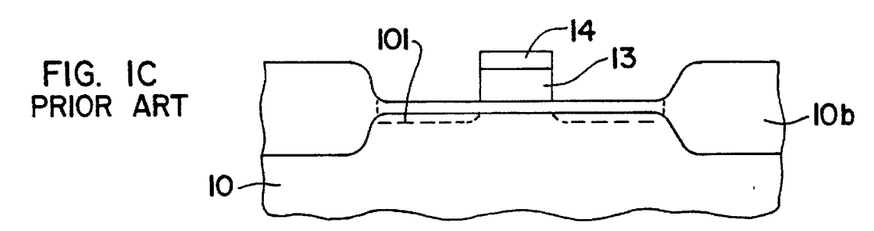

As illustrated in FIG. 1C, an ion-implantation (phosphorus ion) is carried out on the whole surface with a light dose and with a low implanting energy to form $n^-$ region 101.

Figure 1D:
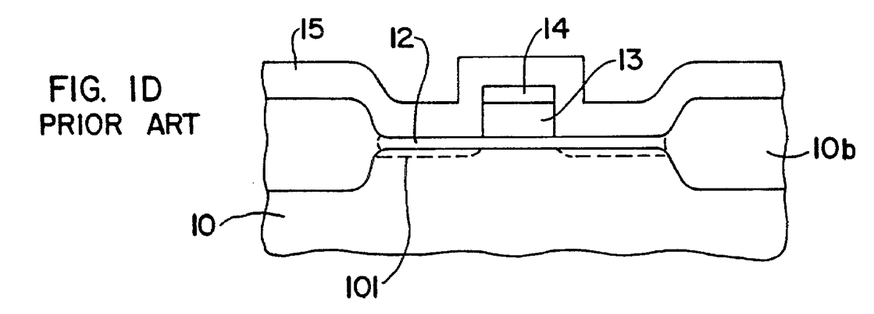

As illustrated in FIG. 1D, silicon oxide layer 15 is deposited on the whole surface by applying a chemical vapor deposition method (CVD) in order to form side wall spacers.

Figure 1E:
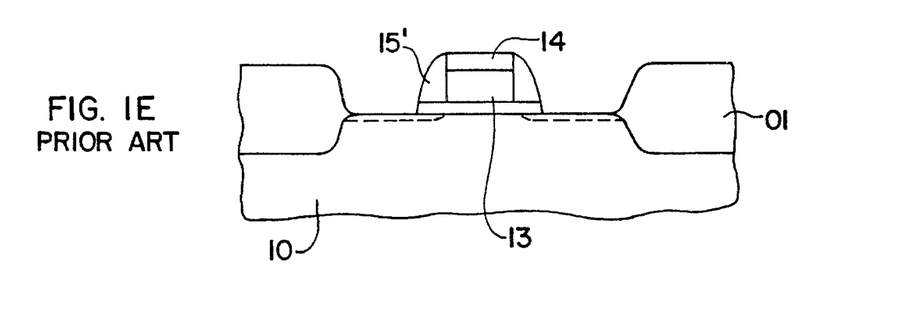

Thereafter, as illustrated in FIG. 1E, the whole surface is etched back by applying a reactive ion etching (RIE) process so that a part of silicon oxide layer 15 remains on the side faces of cap gate oxide layer 14 and gate 13. In this process, gate insulating layer 12 which is not protected by the gate also is etched, thereby exposing the surface of the silicon substrate. Thus, side wall spacer 15' consisting of a part of silicon oxide layer 15 and a part of gate insulating layer 12 is formed on the side walls of cap gate oxide layer 14 and gate 13.

Figure 1F:
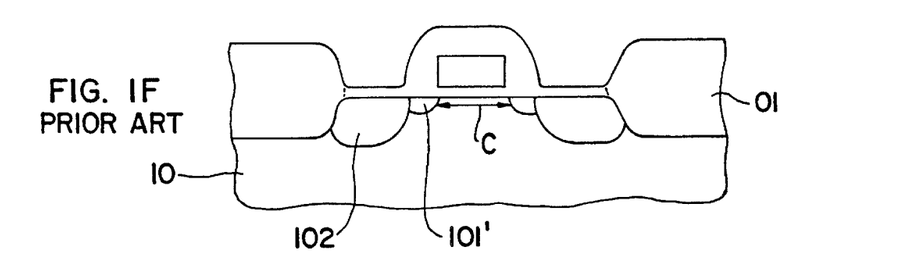

Thereafter, as illustrated in FIG. 1F, an n-type dopant ion implantation is carried out with a large dose, thereby forming source/drain region 102 doped ($n^+$) with a high concentration and having a deep junction. Under this condition, gate side wall spacer 15' plays the role of a barrier during the high concentration ion implantation for forming the source/drain region. Therefore, $n^-$ junction 101', which is not affected by the high concentration doping, if formed between channel C of the gate and source/drain region 102. (Refer to Paul J. Tsang et al., "Fabrication of High Performance LDDFET's with Oxide Sidewall-Spacer Technology" IEEE Transactions on Electron Devices, Vol. ED-29, No. 4, April 1982).

There are, however, several problems in forming LDD devices by providing gate side wall spacers. Particularly, this technology is not suitable for future formation of semiconductor devices requiring high density and high prestige.

In this technique, in order to form a gate side wall spacer, deposition of an oxide is carried out by applying a CVD method, followed by an etch-back. Therefore, during this etching, the active region of the silicon substrate is exposed, and contaminated. Further, the active region of the silicon substrate is over-etched, thereby damaging the silicon substrate. Further, the over-etched depth is not uniform over the positions of the silicon wafer in accordance with the density of the patterns and, therefore, the electrical characteristics of the semiconductor device become non-uniform.

Figure 2:
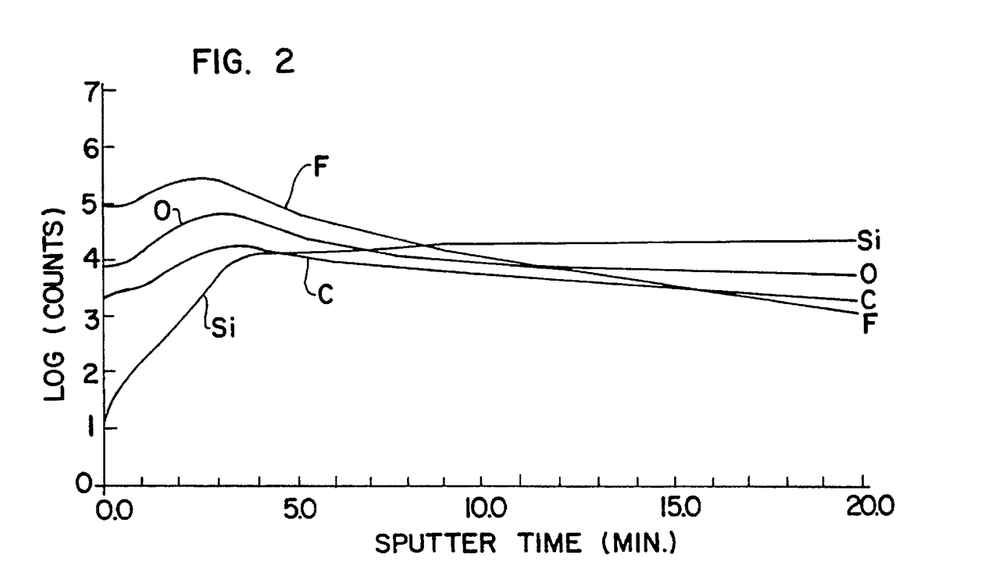

That is, as illustrated in FIG. 2, plasma radical species such as CF3, CHF3 and $O_2$ used during the etching of the oxide layer intrude into the silicon substrate. Therefore, although varying depending on the RF power during etching, a compound layer of about 500 Å is formed, the compounds including $CF_x$ - polymers, Si-C, Si-O, Si-O-C.

FIG. 2 is a graphical illustration of the results of analysis using a secondary ion mass spectroscopy (SIMS) for the case where the plasma radical species intrude into the silicon substrate to contaminate the substrate during the etching of the oxide layer by using CF3, CHF3, $O_2$ and the like based on the conventional technique.

In the graph, the X axis illustrates the depth from the silicon surface, i.e., the value of the projection range as against the sputtering time, while the Y axis illustrates the concentration without unit in relative terms and in a logarithmic value. As can be seen from the graph, the concentrations of fluorine, oxygen and carbon near the surface of the silicon are higher than the concentration of the silicon and, therefore, these elements form a compound layer of about 500 Å from the surface, the compounds being such as $CF_x$-polymers, Si-C, Si-O, and Si-O-C.

In high density devices requiring a shallow junction, the bonding sites of the above-mentioned compounds exist within a depletion region when power is applied to the junction. Therefore, such bonding sites serve the role of a trap center for generating carriers, resulting in an increase in junction leakage current.

Figure 3:
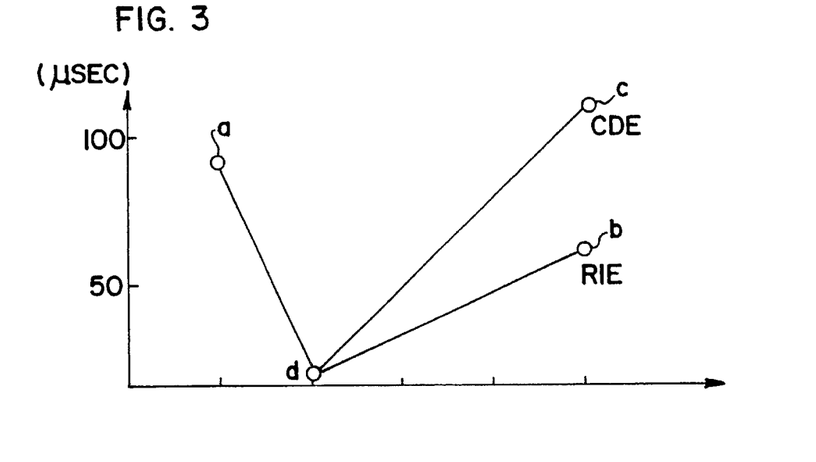
FIG. 3 is a graphical illustration of the variation of the lifetime of the minority carriers according to various etch processes of the side wall oxide.
Figure 4:
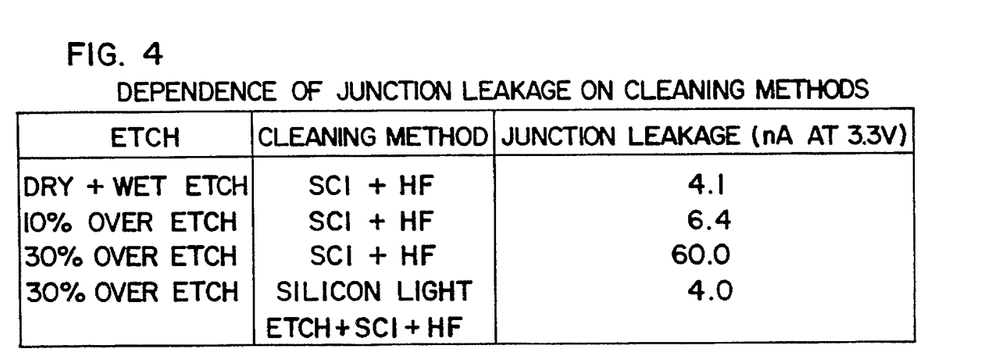
FIG. 4 is a table illustrating the dependence of junction leakage current on various cleaning methods during formation of the gate side wall spacer.

These findings are disclosed in Jeong Kim et al., "Cleaning Process for Removing of Oxide Etch Residue," Proceedings of Contamination Control and Defect Reduction in Semiconductor Manufacturing I, pp. 408–415, 1992, Toronto, and are summarized in FIG. 3 and FIG. 4 (table 4.)

FIG. 3 is a graphical illustration of the variation of the lifetime of minority carriers (a time during which the minority carriers exist in silicon) according to etch processes of the side wall oxide. As illustrated in FIG. 3, the lifetime of the minority carriers are recovered to the original state of the silicon wafer, that is, about 100 μs, similar to the value before etching it. In FIG. 3, the "a" point indicates a lifetime (minority carrier lifetime) in the raw wafer itself (substrate) prior to etching the oxide side wall process. The "d" point indicates a lifetime in the wafer after etching the oxide side wall process by an RIE (reactive ion etch), thus receiving damage. The "b" point indicates a lifetime in the wafer in which the damaged portion is removed by an RIE process. The "c" point indicates a lifetime in the wafer in which the damaged portion is removed by a CDE (low damage Chemical Dry Si substrate Etch) process. The minority carrier lifetime is reduced to about 10 μs ("d" point) just after the etch of the oxide to form the side wall spacer. The damaged substrate is restored to over 100 μs ("c" point) by carrying out a low damage chemical dry etch. Further, if the damaged substrate is removed by a reactive ion etch (RIE), then the lifetime is improved to over 50 μs ("b" point). That is, if the damaged or contaminated portions are removed, the quality of the silicon substrate is restored to the original level.

FIG. 4 illustrates the dependence of junction leakage current on cleaning methods during formation of the gate side wall spacer. As can be seen from FIG. 4, if the silicon substrate is excessively etched, the damaged region increases, and, therefore, junction leakage also increases. If the etch-damaged or contaminated portions are removed, however, the junction characteristics are improved. In other words, in conventional technology in order to make the junction area beside the gate side wall free from damage, an over etch and low damage chemical dry etch process is required.

There is another problem with the conventional technique. Junction leakages were caused by dislocation lines which are across the junction layer from the side wall edge in MOS devices with an LDD structure.

Figure 5:
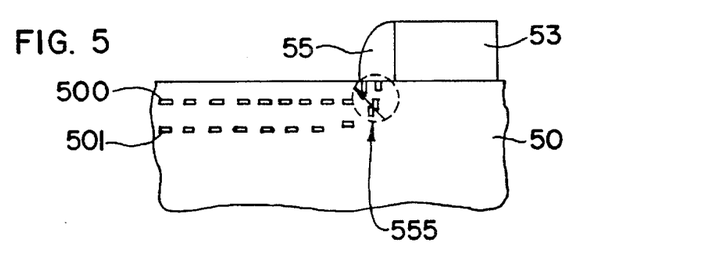
FIG. 5 is a partly sectional view of an NMOSFET having an LDD structure in a conventional semiconductor device.

As illustrated in FIG. 5, the gate side wall spacer is generally formed almost vertical relative to the silicon substrate and, therefore, the stress is concentrated on the corner where the side wall spacer meets the silicon substrate. Therefore, as indicated by dislocation line 555, which is formed from the corner of the spacer to the bulk of the substrate, a crystal defect is formed. This dislocation line increases the leakage current of the junction, and the data retention property is aggravated.

FIG. 5 is a sectional view of a MOSFET having an LDD structure and a silicon dioxide gate side wall spacer in the conventional semiconductor device.

Dislocation loops 500 and 501 which are formed during an $As^+$ ion implantation and subsequent annealing appear on silicon substrate 50 in the form of a loop. Crystal defect 500 of the upper layer is positioned at the depth center $R_p$ of the impurity ions, while crystal defect 501 of the lower layer is positioned at a boundary depth between the non-crystalline and crystalline portions. Particularly, stress generated by differences in thermal properties is concentrated on the corners of side wall spacer 55 of gate 53, with the result that a crystal defect is generated as indicated by dislocation line 555.

It is predicted that such a crystal defect is caused when the thermal stress becomes larger than the silicon bonding energy. Therefore, as illustrated in FIGS. 6A and 6B, the distribution of the stress becomes different in accordance with the shape of the gate side wall spacer.

Figure 6A:
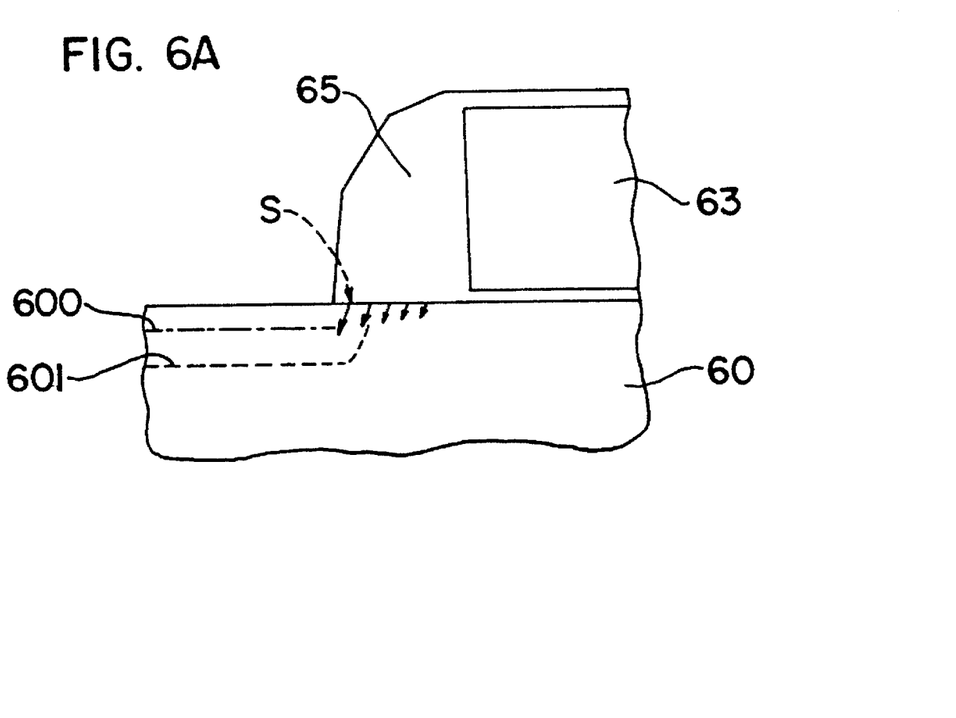
FIG. 6A and 6B illustrate the distribution of the stress from the gate side wall to the silicon substrate for an NMOSFET having an LDD structure in a conventional semiconductor device.
Figure 6B:
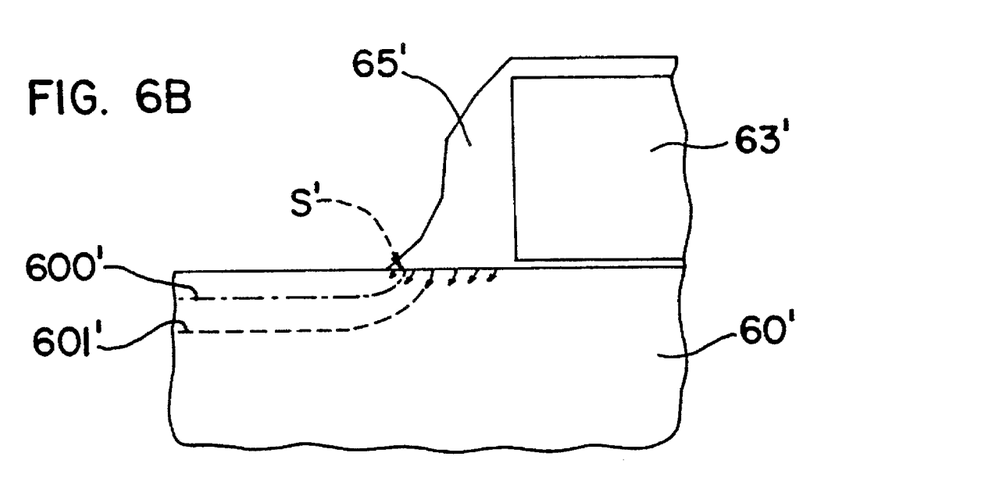

FIGS. 6A and 6B illustrate the stress distribution from the gate side wall spacer to the silicon substrate of an NMOS-FET having an LDD in a conventional semiconductor device.

Referring to FIG. 6A, a crystal defect in impurity diffusion layers 600 and 601 results from side wall spacer 65 due to the difference between the thermal expansion rates of silicon substrate 60 and gate side wall oxide layer 65. When the steeply shaped side wall is formed, the stress is concentrated at the side wall edge and indicates a value of about $5.4 \times 10^9$ $dyn/cm^2$. This stress exceeds the bonding energy of the crystal, thereby leading to defect "S" in FIG. 6A. That is, the magnitude of the stress becomes larger than the silicon bonding energy, with the result that dislocation "S" occurs.

Referring to FIG. 6B, if the side wall spacer is less steeply shaped, the stress is concentrated at the side wall edge and indicates a value of about $2.7 \times 10^9$ $dyn/cm^2$. Thus a defect depicted "S'" in FIG. 6B occurs only a little. Here also side wall spacer 65' at gate 63' affects diffusion layers 600' and 601' due to thermal expansion differences between silicon substrate 60' and gate side wall oxide layer 65'.

In short, the stress imposed on the silicon substrate is varied within the range of about $2.7 \times 10^9 – 5.4 \times 10^9$ $dyn/cm^2$ in accordance with the shape of the gate side wall spacer and the angle between the spacer and the substrate. The steeper the side wall spacer relative to the substrate, the more frequent the crystal defect, i.e., the more frequent the dislocation. (Refer to Shigeo Onishi et al., "Formation of a Defect Free Junction Layer by Controlling Defects Due to $As^+$ Implantation" IEEE/ERPS, 1991, pp. 255–259.)

Figure 8:
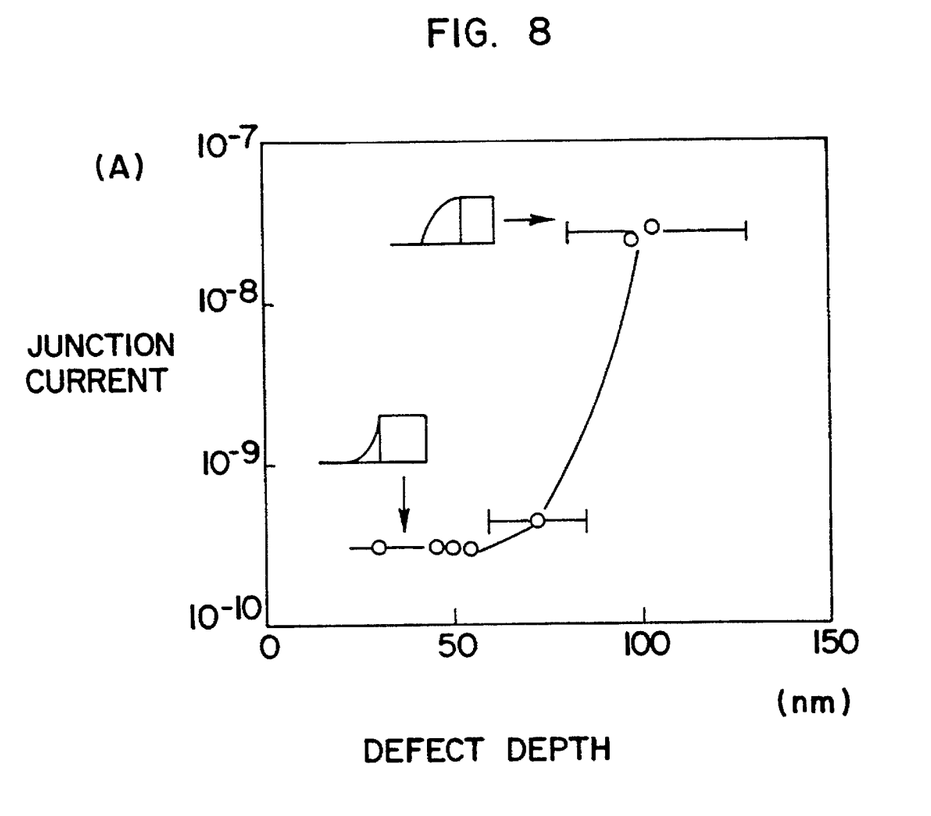
FIG. 8 illustrates junction leakage current versus the dislocation line depth in the substrate.

FIG. 8 is a graphical illustration of the junction leakage current versus dislocation depth in the side wall spacer.

The X axis illustrates the depth of the dislocation line based on the profile of the conventional gate side wall spacer, while the Y axis illustrates the magnitude of the leakage current. It is seen that the greater the steepness of the side wall spacer, the greater the leakage current.

As the size of the device is scaled down, the acceptable tolerance is reduced. Therefore, there are still unsolved problems in that plasma species intrude into the substrate during deposition of the oxide layer based on a CVD process (which is the critical step in the formation of the gate side wall spacer), and during the etching due to the over-etch. Another problem is the degradation of the device characteristics (such as leakage current at the junction layer) due to the crystal defect such as dislocations attributed to the profile of the side wall spacer. Therefore, a study is being carried out for improving the manufacturing process for an LDD device utilizing a conventional side wall spacer.

Also another study is being carried out for obtaining a solution to the problems of forming an LDD device utilizing the side wall spacer based on a substitution method.

Figure 7A:
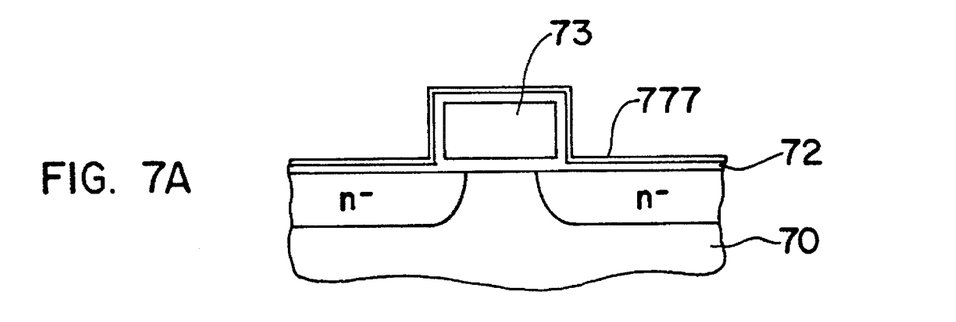
FIGS. 7A–7C a process for formation of an LDD transistor using a side wall spacer and adding an etch stop layer as an improvement of the conventional techniques.
Figure 7B:
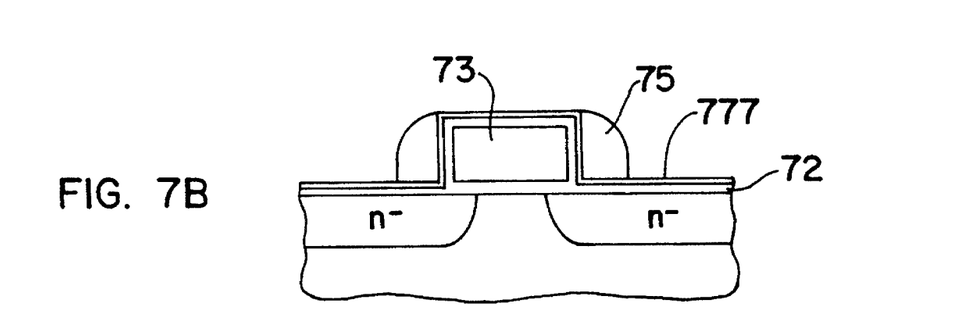
Figure 7C:
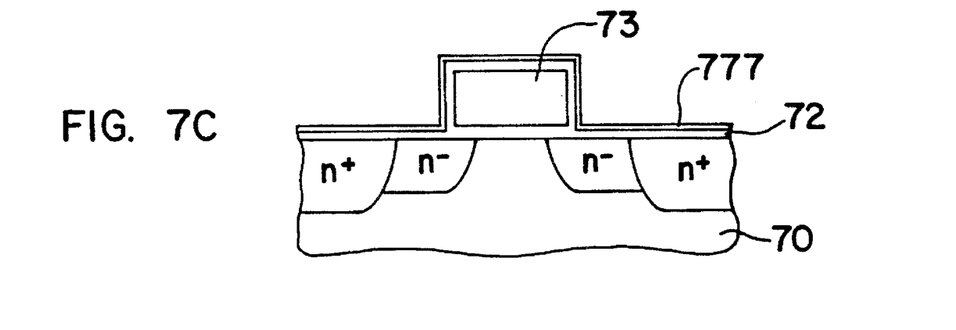

FIGS. 7A to 7C illustrate an improvement of the conventional technique of forming an LDD transistor by adding an etch stop layer and utilizing a side wall spacer.

As illustrated, gate 73 is patterned, and etch stop layer 777 (polysilicon or Si3N4) is formed on gate insulating and pad oxide layer 72 to protect silicon substrate 70 during etch-back of CVD $SiO_2$ for forming side wall spacer 75. Then CVD $SiO_2$ 75 is deposited and etched back, so that an excessive etch of the silicon substrate and contamination of the etchant with plasma species are prevented. In the last step illustrated in FIG. 7C, in order to form a highly doped impurity region n+, an ion implantation is carried out, and after removing spacer 75, an ion implantation is carried out to form a lightly doped impurity region n−.

This conventional technique, however, cannot give a solution to the problem of the defect of crystal dislocation which is caused by the profile of the side wall spacer.

Another method suggested in U.S. Pat. No. 4,599,118 is an overhang technique where a stacked structure of $SiO_2$/Si3N4/polysilicon/$SiO_2$ is gate-patterned and the polysilicon is excessively etched, thereby forming an $SiO_2$/Si3N4 overhang. An $As^+$ source/drain ion implantation is carried out using the overhang as an ion implantation mask, and the overhang is removed in order to carry out an $n^-$ ion implantation for forming an $n^-$ region.

In brief, the scaled-down transistors come to have short channels, with the result that hot carriers are produced, thereby raising the problem of hot carrier instability. In order to overcome this problem, a transistor having an LDD has been proposed, and in the practical fields, the LDD was formed utilizing a gate side wall spacer. In high density devices of over 16 mega-bit DRAMs, however, the LDD device formed by utilizing a side wall spacer has become unsuitable for the reasons cited above.

SUMMARY OF THE INVENTION

The present invention is intended to overcome the above described disadvantages of the conventional techniques.

It is an object of the present invention to provide a process for formation of an MOS transistor in which an LDD MOSFET is formed without using a side wall spacer as an ion implantation inhibiting layer, so that the process is suitable for manufacturing high density semiconductor devices such as DRAMs of over 16M bits in density. The present invention provides a process for formation of an MOS device having an LDD structure, which is suitable for manufacturing a VLSI (very large scaled integrated circuit).

According to one embodiment of the present invention, the process of the present invention includes the steps of: forming a first insulating layer, a conductive layer and an auxiliary layer upon a semiconductor substrate in the cited order; removing the relevant portion of the auxiliary layer to form an auxiliary layer pattern such as a gate pattern on the conductive layer; depositing a temporary layer on the auxiliary layer pattern and on the exposed conductive layer, and etching it back to form a temporary layer spacer on the side wall of the auxiliary layer pattern; removing the relevant portion of the conductive layer by utilizing the auxiliary layer pattern and the temporary layer spacer as the mask, and forming a high concentration first dopant buried layer within the semiconductor substrate; and removing the temporary layer spacer, forming a gate electrode by etching the conductive layer by utilizing the auxiliary layer pattern as the mask, and forming a low concentration second dopant buried layer within the semiconductor substrate.

According to another embodiment of the present invention, instead of the second insulating layer, the process is carried out using a second conductive layer which has an etch selectivity relative to the first conductive layer.

Further, heat treatments are carried out on the first dopant buried layer and the second dopant buried layer to form an LDD type drain electrode.

BRIEF DESCRIPTION OF THE DRAWINGS

The above objects and other advantages of the present invention will become more apparent describing in detail the preferred embodiments of the present invention with reference to the attached drawings in which:

FIG. 2 is a graphical illustration of the results of an analysis of an over-etched silicon substrate using SIMS (secondary ion mass spectroscopy) and illustrating the contamination of the silicon substrate by the intruding plasma radicals during the etch of the oxide layer using gases of CF3, CHF3, $O_2$ and the like;

DESCRIPTION OF THE PREFERRED EMBODIMENTS

FIG. 9A–9H an embodiment of the present invention, which is a process for forming an LDD MOSFET.

Figure 9A:
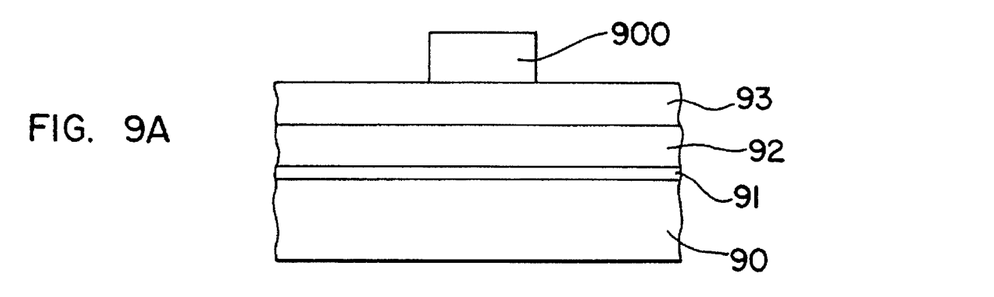
FIGS. 9A–9H are partly sectional views illustrating a process for forming an MOS field effect transistor having an LDD structure according to one embodiment of the present invention.

As illustrated in FIG. 9A, an isolating region (not illustrated) and an active region (reference code not illustrated) are formed on p type silicon substrate 90. First insulating layer 91 (an oxide layer) which is a gate insulating layer is formed to a thickness of about 100 Å by subjecting the surface of silicon substrate 90 to a thermal oxidation.

A non-crystalline polysilicon or an in-situ doped polysilicon layer is deposited on first insulating layer 91 to a thickness of about 2000 Å by applying a low pressure chemical vapor deposition method (LPCVD).

A silicon oxide layer, which is auxiliary layer 93, is deposited on conductive layer 92 to a thickness of about 1500 Å by applying a CVD method.

Photo resist is spread on auxiliary layer 93, and photo resist pattern 900 is formed through exposing and developing with a gate forming mask.

Figure 9B:
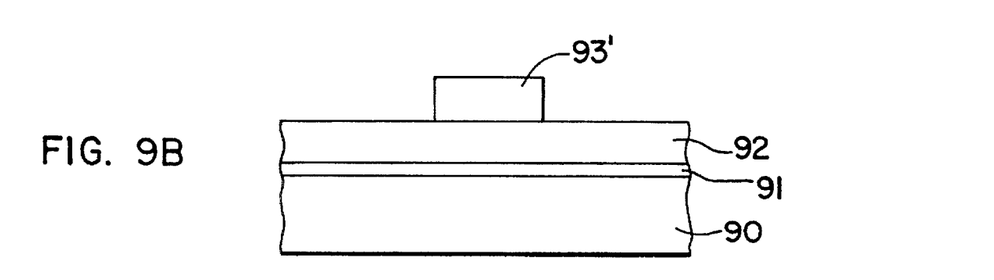

As illustrated in FIG. 9B, the portion of auxiliary layer 93 which is not protected by photo resist pattern 900 is removed by applying a reactive ion etching (RIE) process. Thus there is defined auxiliary layer pattern 93', which consists of a portion of auxiliary layer 93 remaining on the polysilicon layer, i.e., on conductive layer 92, which is to be formed into a gate electrode.

Photo resist pattern 900 is removed by dipping into an $H_2SO_4/H_2O_2$ mixture solution.

Figure 9C:
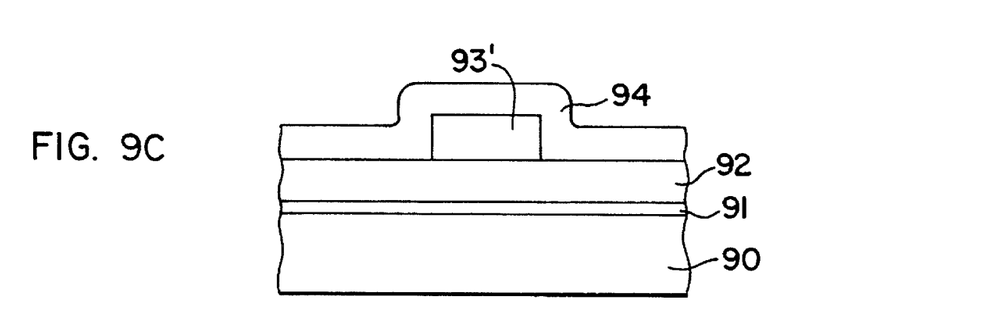

As illustrated in FIG. 9C, a silicon nitride layer, which is temporary layer 94, is deposited to a thickness of about 1500 Å on the sides of auxiliary layer pattern 93' and on the surface of exposed conductive layer 92.

Figure 9D:
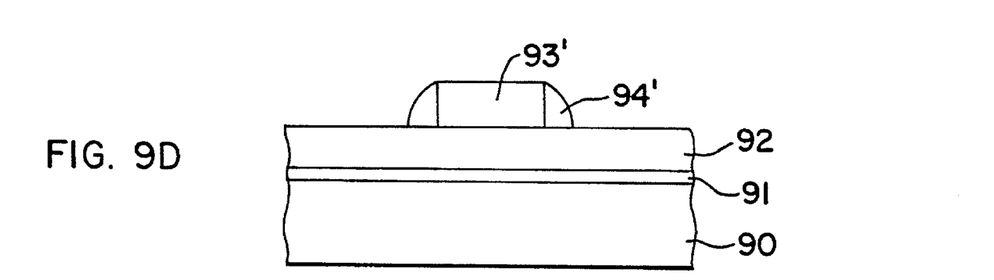

As illustrated in FIG. 9D, a reactive ion etching (RIE) process is carried out on third insulating layer 94 using a $CHF_3/CF_4$ gas plasma, until the surface of conductive layer 92 is exposed. Thus, side wall spacer 94', which is composed of silicon nitride, is formed on auxiliary layer pattern 93', which consists of an oxide layer.

Figure 9E:
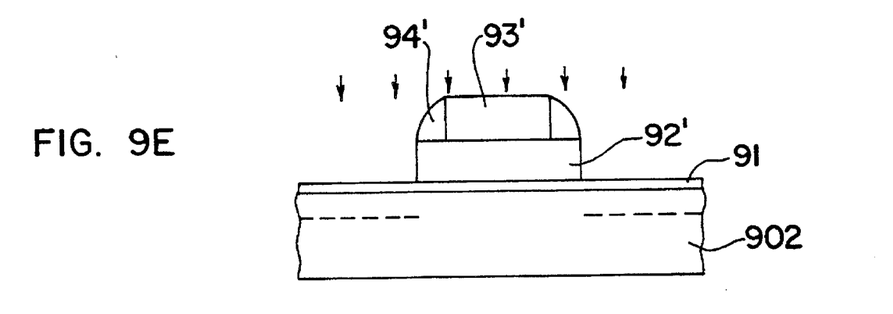

As illustrated in FIG. 9E, the polysilicon layer, i.e., conductive layer 92, is subjected to a dry anisotropic etching using $HBr/Cl_2$ gas plasma and utilizing the remaining portion of side wall spacer 94' (the third insulating layer) and auxiliary layer pattern (93') as the etch inhibiting layer. This etching is continued until the oxide layer, i.e., the first insulating layer, is exposed, thereby forming conductive layer pattern 92'

The width of pattern 92' thus formed is made to be larger than the designed gate by twice the thickness of side wall spacer 94', so that it may serve the role of an ion implantation inhibiting layer during an ion implantation for forming a drain/source region at a later step. Thus, the expanded width affords an ion buried layer formation portion for forming an LDD structure on silicon substrate 90, i.e., on the lower region of side wall spacer 94'. During such an etching, the silicon substrate is protected by the first insulating layer, and, thereby addressing the problem of contamination of the substrate, which was described referring to FIGS. 2 to 4.

A first ion implantation for forming a heavily doped source/drain region is carried out on the whole surface of the wafer using $As^+$ ions at a concentration of about $5.0 \times 10^{15}$ ions/cm$^2$ and with an energy of about 40 KeV, and utilizing conductive layer pattern 92', or auxiliary layer pattern 93' and side wall spacer 94' as the ion implantation inhibiting layers. As a result, $As^+$ ions are implanted into the silicon substrate, thereby forming first dopant buried layer 902.

Under this condition, unlike the conventional method, the side wall spacer and the gate which are directly contacted with the silicon substrate are not used, but the over-sized conductive layer patterns are utilized, and therefore the problems of affecting the electrical characteristics of the device as described with reference to FIGS. 5 to 8 are eliminated.

Figure 9F:
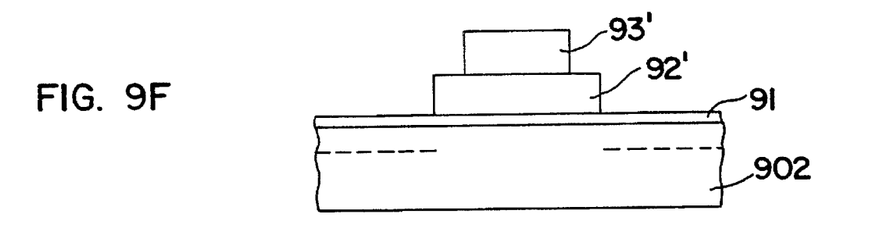

As illustrated in FIG. 9F, the nitride layer which forms side wall spacer 94' is removed by a wet etching, i.e., by dipping it into an $H_3PO_4$ solution having a temperature of about 180° C. Accordingly, the width of auxiliary layer pattern 93' becomes the same as that of photo resist pattern 900 which was defined at the step of FIG. 9A using the gate forming mask. Further, the width of auxiliary layer pattern 93' becomes smaller than that of conductive layer pattern 92', which is disposed under the second insulating layer pattern.

Figure 9G:
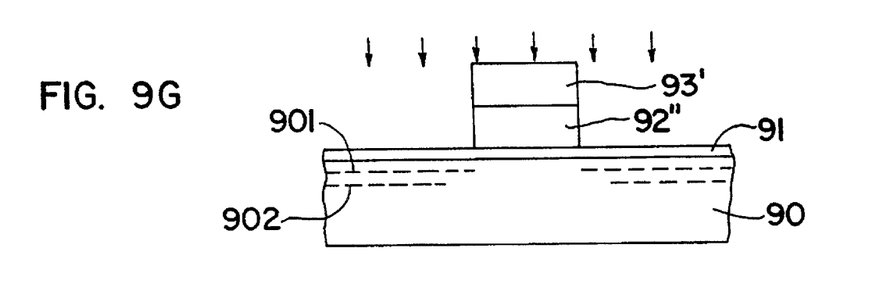

As illustrated in FIG. 9G, a reactive ion etching is carried out using an $HBr/Cl_2$ gas plasma and utilizing auxiliary layer pattern 93' as the etch inhibiting layer. Thus the portions of conductive layer pattern 92' which are not protected by etch inhibiting layer 93' are anisotropically removed, thereby forming gate 92".

Under this condition, the surface of silicon substrate 90 is protected by first insulating layer 91 and, therefore, the problem of the over-etching and contamination of the substrate is prevented.

A second ion implantation for forming a lightly doped drain (LDD) is carried out on the whole surface of the wafer with a surface ion concentration of about $2.0 \times 10^{13}$ ions/cm$^2$ and with an energy of about 30 KeV and using phosphorus ions and utilizing auxiliary layer pattern 93' or the gate 92" (disposed under the former) as the ion implantation inhibiting layer. As a result, second dopant ion buried layer 901 for forming the LDD structure is formed upon first dopant ion buried layer 902.

Figure 9H:
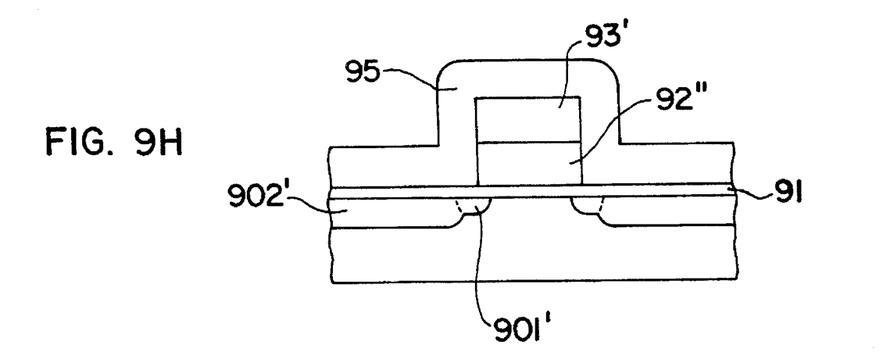

As illustrated in FIG. 9H, an oxide layer which is fourth insulating layer 95 for insulating gate 92" is deposited to a thickness of about 1500 Å on the surface and sides of auxiliary layer pattern 93', on the sides of gate 92" and on the surface of first insulating layer 91.

Thereafter, the dopant buried layers such as second dopant buried layer 901 and first dopant buried layer 902 for forming the source/drain region and the LDD structure are heat-treated at a temperature of about 870° C. for about 40 minutes to form LDD 901' and source/drain region 902', thereby completing the formation of the LDD MOSFET according to the present invention.

Although not illustrated in the drawings, another embodiment of the present invention is carried out in the following manner. That is, at the step of FIG. 9A, instead of forming the auxiliary layer in the form of a silicon oxide layer, the second conductive layer is formed by depositing a silicide (tungsten silicide) to a thickness of about 1500 Å, thereby forming an LDD MOSFET which is same as that of FIG. 9.

The present invention provides a process for formation of not only an NMOSFET, but also a PMOSFET. When carrying out the first and second ion implantation during the formation of the PMOSFET, the ions used are $BF_2^+$ or $B^+$ ions.

According to the present invention as described above, the problems which appear during the etching of the oxide layer for forming the side wall spacer are eliminated. That is, problems such as excessive etching of the silicon substrate causing an irregularity of the substrate, the intrusion of the plasma gas into the substrate, and the consequent contamination of the substrate and the consequent degradation of the characteristics of the semiconductor device (the increase of the leakage current at the junction) are all addressed. Further, the generation of crystalline defects which grow from the corner of the spacer toward the bulk of the substrate after being born by the stress due to the spacer profile brings TR defects on random sites or brings random bit failures of the memory cells. If the LDD type transistor is formed by the present invention, this problem is solved, with the result that the yield of the device is greatly improved.

Further, the semiconductor device of the present invention is suitable as a unit transistor for high density memory devices of the coming generation, which require very low junction leakage current, and which will be highly difficult to manufacture. If the process of the present invention is employed in manufacturing a CMOS transistor, the process can be simplified.

This process will be described referring to FIG. 10.

Figure 10A:
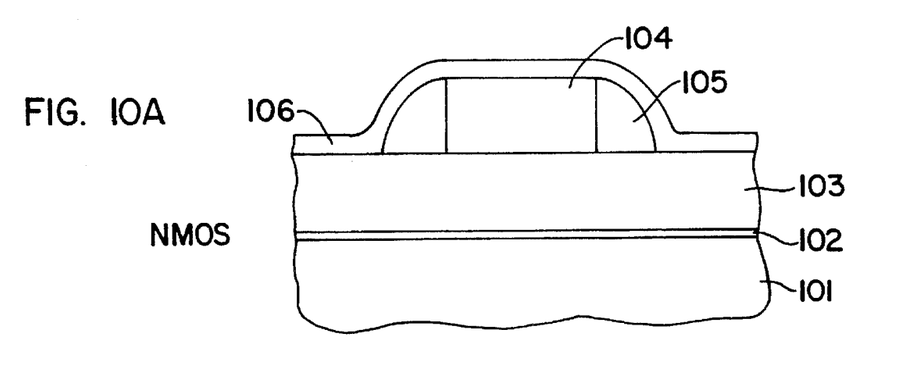
FIGS. 10A–10E are partly sectional views illustrating a process for forming an MOS field effect transistor having an LDD structure according to another embodiment of the present invention.
Figure 10B:
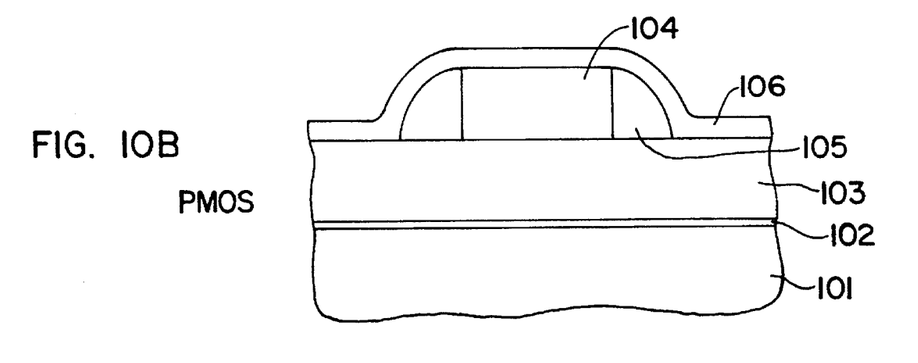

First as illustrated in FIGS. 10A and 10B, gate oxide layer 102 is grown on semiconductor substrate 101 after completing a p-well or n-well forming step. Polysilicon layer 103 for forming a polysilicon gate is deposited thereupon, and an oxide is deposited or grown to a sufficient thickness thereupon. The oxide layer is etched by applying a photo etching process using a gate mask, thereby forming gate pattern 104 which is made of an oxide. $Si_3N_4$ is deposited and etched back to form spacer 105 at the sides of oxide gate pattern 104.

Thereafter, for carrying out an NMOS formation process, the PMOS region is covered with a photo resist PR, opening only the NMOS region, thereby removing CVD oxide layer 106. Under this condition, the etching is stopped at the oxide layer of oxide gate pattern 104. This can be achieved by utilizing a well adjusted etching time, or a low etch rate is used after forming the oxide layer upon the polysilicon by a thermal oxidation, thereby removing only the CVD oxide.

Figure 10C:
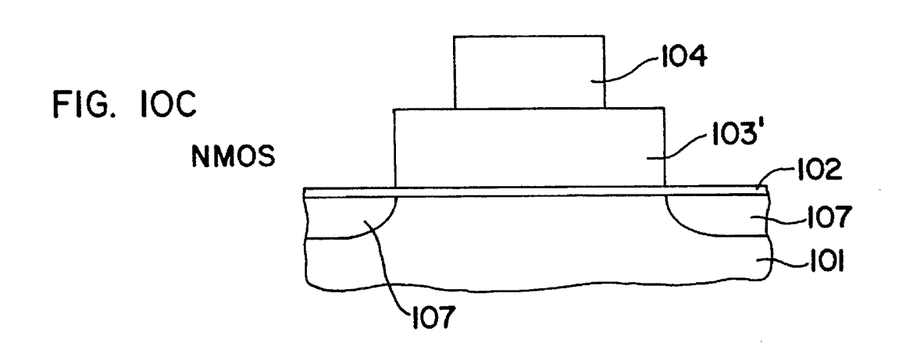

Thereafter, the PMOS region is left with oxide layer 106 covered, and as illustrated in FIG. 10C, polysilicon layer 103 is dry-etched utilizing nitride spacer 105 and oxide layer 104 of the NMOS region as a mask, thereby forming temporary gate electrode 103' which is large enough to serve as an ion implanting mask for forming a source/drain region.

Thereafter, an $n^+$ dopant is ion implanted, and a heat treatment is carried out to form source/drain region 107. Under this condition, in order to prevent the etch of the silicon, an oxidation is carried out at a temperature of about 900° C. for several minutes under an $O_2$ gas atmosphere, after the $n^+$ ion implantation. The nitride layer spacer is removed by dipping into an $H_3PO_4$ solution (at about 180° C). Polysilicon layer 103', which is a temporary gate electrode, is removed again by using remaining oxide layer 104 as a mask, thereby forming gate electrode 108. Then $n^-$ ions are implanted to form LDD region 110.

Figure 10D:
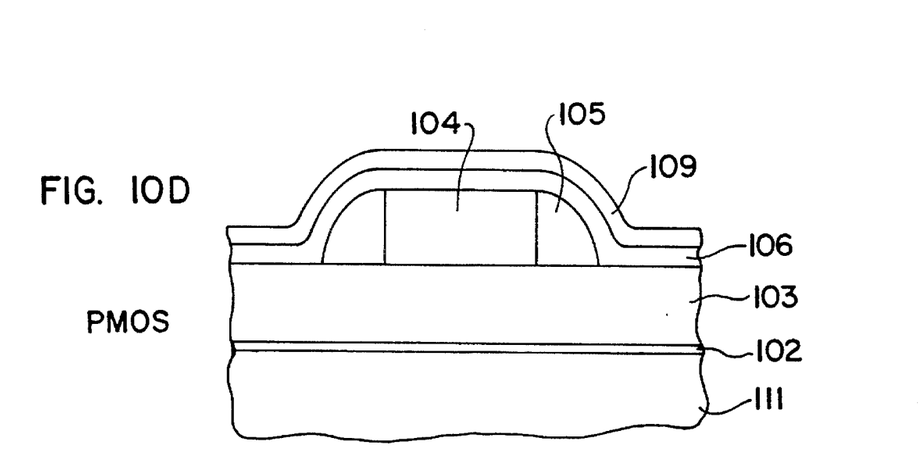
Figure 10E:
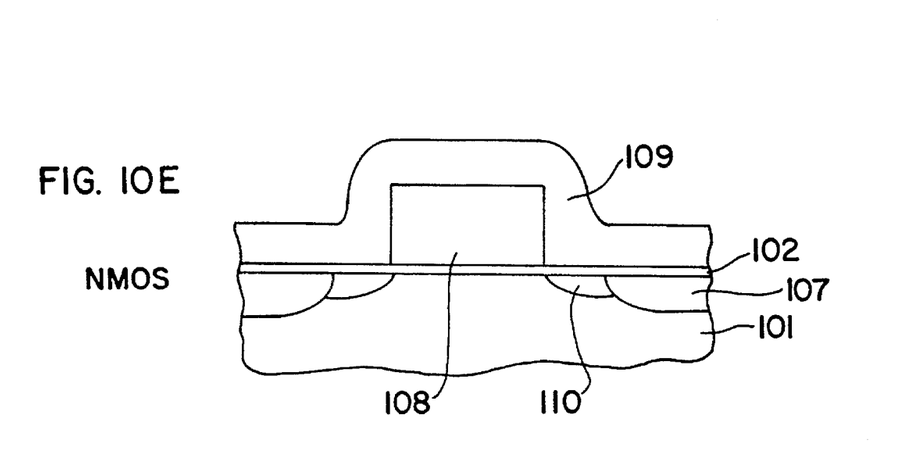

As illustrated in FIGS. 10D and 10E, CVD oxide layer 109 is deposited.

A photo process is carried out for the PMOS region to form an LDD as in the case of the NMOS regions.

If the process of the present invention is applied to the formation of a CMOS transistor, two masking steps can be skipped. That is, four masks for ion implantation of $n^-$, $n^+$, $p^-$ and $p^+$ are required, but according to the present invention, only two of these masks are required.

U.S. Pat. No. 4,722,909 discloses CMOS process having some similarity, but the present invention solves the problems of the technique in this patent.

To describe it more in detail, in this U.S. patent, an $n^+$ ion implantation is carried out after carrying out a photo process for forming an NMOS region. Then the disposable side wall spacer is removed, and an $n^-$ ion implantation is carried out. Thus, there is disclosed a method which is capable of skipping two masking steps, i.e., one each of the NMOS and PMOS process for the CMOS transistor. The advantages of this process are as follows. That is, a heat treatment is carried out after an $n^+$ ion implanting, and an $n^-$ ion implantation is carried out after forming a junction. In this way, only the junction is formed in a very thin form, so that the short channel characteristics of the deep sub-micron scale device may be improved. Further, a disposable side wall spacer is formed, and by utilizing this spacer, an $n^+$ ion implantation is carried out. After removing this layer, an $n^-$ ion implantation is carried out. As a result, one masking step can be reduced. That is, in the case of a CMOS transistor, one each of masking step from the NMOS and the PMOS can be reduced, resulting in the reduction of two masking steps.

That is, an $n^-$ ion implantation is carried out, and then an $n^+$ ion implantation is carried out. In order to remove the lattice defect which is caused during the $n^+$ ion implantation, a heat treatment is carried out for a long time at a high temperature. Consequently, the length of the junction of the $n^-$ is extended, and consequently, the short channel characteristics of the deep sub-micron device is aggravated. This is the problem of the prior art. However, the above U.S. patent solved this problem in the following manner. That is, an $n^+$ ion implantation is carried out, and a heat treatment is carried out. Then an $n^-$ ion implantation is carried out, and, in this case, owing to the low concentration of the $n^-$ ion implantation, the lattice defect is almost eliminated. Therefore, the heat treatment process is minimized, thereby solving the problem of the extension of the $n^-$ junction.

In this U.S. patent, however, during the etching of the disposable spacer, a problem is the loss of the gate oxide. The disposable spacer is composed mainly of CVD-Al, W series, and this causes contamination of the gate oxide layer. Further, when etching the disposable spacer, losses occur to the gate oxide, with the result that the reliability of device is aggravated.

According to the CMOS process of the present invention as described above, however, the disposable LDD spacer is formed by depositing the relevant material, and, therefore, problems such as the contamination of the gate oxide and the loss of the gate oxide during the etching are solved. That is, the gate pattern is indirectly formed by depositing an oxide layer and a $Si_3N_4$ nitride layer on the gate polysilicon, thereby solving the problem. Further, the simplification of the process and the device optimization are maintained, while the reliability of the device can be improved. Under this condition, the photo resist barely withstands the process of etching the nitride layer with $H_3PO_4$ at a temperature of about 180° C. and, therefore, a protection layer is formed with a CVD oxide. If the photo resist PR which is capable of withstanding against the nitride layer etching process is used, then the CVD protection layer may be omitted, and only the photo resist PR is used, thereby simplifying the process.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for forming a MOSFET comprising the steps of:

(a) forming a first insulating layer, a conductive layer and an auxiliary layer upon a semiconductor substrate;

(b) etching portions of the auxiliary layer to form an auxiliary layer pattern;

(c) forming a temporary layer side wall spacer at the sides of the auxiliary layer pattern;

(d) etching portions of the conductive layer utilizing the auxiliary layer pattern and the temporary layer spacer as a mask, and forming a high concentration first dopant buried layer within the semiconductor substrate; and (e) removing the temporary layer spacer, forming a gate electrode by etching the conductive layer utilizing the auxiliary layer pattern as a mask, and forming a low concentration second dopant buried layer within the semiconductor substrate.

2. The process as claimed in claim 1, wherein, at step (a), the first insulating layer is formed by applying a thermal oxidation process to form silicon oxide.

3. The process as claimed in claim 1, wherein, at step (a), the conductive layer comprises polysilicon.

4. The process as claimed in claim 1, wherein, at step (a), the conductive layer is formed by depositing an in-situ doped polysilicon to a thickness of about 2000 Å by applying an LPCVD process.

5. The process as claimed in claim 1, wherein, at step (a), the auxiliary layer is formed by depositing silicon oxide applying a CVD method.

6. The process as claimed in claim 1, wherein, at step (c), the temporary side wall spacer comprises silicon nitride.

7. The process as claimed in claim 6, wherein the temporary layer side wall spacer is formed by depositing silicon nitride to a thickness of about 1500 Å by applying an LPCVD method, and by carrying out an anisotropic etching on the silicon nitride using a $CHF_3/CF_4$ gas plasma and utilizing the conductive layer as an etch stop layer.

8. The process as claimed in claim 1, wherein the conductive layer is etched by applying a dry etching process using the auxiliary layer pattern and the temporary layer spacer as an etch inhibiting layer, and using the first insulating layer as an etch stop layer, and using an $HBr/Cl_2$ gas plasma.

9. The process as claimed in claim 1, wherein the first dopant buried layer is formed with a first ion implantation method using As ions at a concentration of about $5.0 \times 10^{15}$ ions/$cm^2$ and with an energy of about 40 KeV.

10. The process as claimed in claim 1, wherein the second dopant buried layer is formed with a second ion implantation method using phosphorus ions at a concentration of about $2.0 \times 10^{13}$ ions/$cm^2$ and with an energy of about 30 KeV.

11. The process as claimed in claim 1, wherein the temporary layer spacer is removed with a wet etching method by dipping into an $H_3PO_4$ solution at a temperature of about 180° C.

12. The process as claimed in claim 1, wherein, at step (a), conductive layer is formed as a first conductive layer comprising a conductive material, and the auxiliary layer is formed as a second conductive layer comprising a second conductive material.

13. The process as claimed in claim 12, wherein the first conductive layer comprises polysilicon, and the second conductive layer comprises silicide.

14. The process as claimed in claim 12, wherein the first conductive layer is formed by depositing an in-situ doped polysilicon to a thickness of about 2000 Å using an LPCVD method, and the second conductive layer is formed by depositing a CVD W silicide to a thickness of about 1500 Å.

15. The process as claimed in claim 12, wherein the temporary layer side wall spacer is formed by depositing silicon nitride to a thickness of about 1500 Å based on an LPCVD method, and carrying out an anisotropic etching on the silicon nitride layer using a $CHF_3/CF_4$ gas plasma and utilizing the first conductive layer as an etch stop layer.

16. The process as claimed in claim 1, wherein, after step (e), the first and second dopant buried layers are heat-treated at a temperature of about 870° C. for about 40 minutes.

17. The process as claimed in claim 1, wherein the semiconductor substrate comprises a p type silicon substrate.

18. The process as claimed in claim 1, wherein the first dopant buried region is formed using $BF_2$ or B ions at a concentration of about $5.0 \times 10^{15}$ ions/$cm^2$ and with an energy of about 40 KeV.

19. The process as claimed in claim 1, wherein the second dopant buried region is formed using $BF_2$ or B ions at a concentration of about $2.0 \times 10^{13}$ ions/$cm^2$ and with an energy of about 30 KeV.

20. A process for formation of a CMOS semiconductor device, comprising the steps of:

(a) forming a first insulating layer, a conductive layer and an auxiliary layer upon a semiconductor substrate;
etching portions of the auxiliary layer to form an auxiliary layer pattern;
forming a temporary layer side wall spacer at the sides of the auxiliary layer pattern;

(b) defining an NMOS region, and etching the conductive layer using the temporary side wall spacer and the auxiliary layer pattern of the NMOS region as a mask;
forming an n type heavily doped region using the etched conductive layer as a mask;
removing the temporary side wall spacer, and etching the conductive layer using the auxiliary layer pattern as a mask to form an NMOS gate electrode;
forming an n type lightly doped region using the NMOS gate electrode as a mask;

(c) defining a PMOS region, and etching the conductive layer using the temporary side wall spacer and the auxiliary layer pattern of the PMOS region as a mask;
forming a p type heavily doped region using the etched conductive layer as a mask;
removing the temporary side wall spacer, and etching the conductive layer using the auxiliary layer pattern as a mask to form a PMOS gate electrode; and
forming a p type lightly doped region using the PMOS gate electrode as a mask.

21. The process as claimed in claim 20, wherein the temporary layer side wall spacer comprises silicon nitride having an etch selectivity relative to the conductive layer and the auxiliary layer.

22. The process as claimed in claim 20, wherein, at step (b), after the n type heavily doped region is formed, it is heat-treated at a temperature of about 900° C. under an $O_2$ gas atmosphere.

23. The process as claimed in claim 20, wherein, after carrying out step (a), a first oxide layer is formed, and an NMOS region is opened during the NMOS process; and after carrying out step (b), a second oxide layer is formed, and a PMOS region is opened during the PMOS process.

24. The process as claimed in claim 20, wherein the semiconductor substrate is provided with p wells and n wells.

* * * * *